（12） United States Patent
Cao et al.

(10) Patent No.: US 10,892,788 B2
(45) Date of Patent: Jan. 12, 2021

(54) LOW COMPLEXITY MIMO DIGITAL PRE-DISTORTION

(71) Applicant: TELEFONAKTIEBOLAGET LM ERICSSON (PUBL), Stockholm (SE)

(72) Inventors: Haiying Cao, Beijing (CN); Spendim Dalipi, Sollentuna (SE); Per Landin, Kumla (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 0 days.

(21) Appl. No.: 16/603,529

(22) PCT Filed: Apr. 7, 2017

(86) PCT No.: PCT/IB2017/052037
§ 371 (c)(1),
(2) Date: Oct. 7, 2019

(87) PCT Pub. No.: WO2018/185532
PCT Pub. Date: Oct. 11, 2018

(65) Prior Publication Data
US 2020/0059256 A1    Feb. 20, 2020

(51) Int. Cl.
H04B 1/04    (2006.01)
H03F 1/32    (2006.01)
(Continued)

(52) U.S. Cl.
CPC ......... *H04B 1/0475* (2013.01); *H03F 1/3247* (2013.01); *H03F 3/245* (2013.01);
(Continued)

(58) Field of Classification Search
CPC ............... H04B 1/0475; H04B 7/0417; H04B 2001/0425; H04B 7/0413; H04B 7/0615;
(Continued)

(56) References Cited

U.S. PATENT DOCUMENTS 8,948,301 B2 * 2/2015 Rollins ............... H04B 1/0475
375/296
2010/0316157 A1  12/2010 Bassam et al.
(Continued)

OTHER PUBLICATIONS

Suryasarman et al. "a comparative analysis of adaptive digital predistortion algorithms from multiple antenna transmitters"; IEEE transactions on circuits and systems; vol. 62, No. 5, May 2015, pp. 1412-1420 (Year: 2015).*
(Continued)

*Primary Examiner* — Rahel Guarino

(57) ABSTRACT

A method and a transmitter arrangement for cancelling cross talk and correcting power amplifier (PA) distortion for a transmitter branch of a multiple-input multiple-output (MIMO) configuration having multiple branches. The method comprises combining an original baseband input signal of a first MIMO transmitter branch with a crosstalk
(Continued)

output signal generated from two or more signals associated with two or more respective MIMO branches, the two or more signals used as input to, and processed by, a crosstalk model. The method further comprises processing the combined signal to generate an output signal in order to minimize the error of the original baseband input signal caused by the crosstalk and/or PA distortion.

20 Claims, 10 Drawing Sheets

(51) Int. Cl.
| | |
|---|---|
| H03F 3/24 | (2006.01) |
| H04B 7/0417 | (2017.01) |
| H04B 7/0456 | (2017.01) |
| H04B 7/06 | (2006.01) |
| H04L 25/03 | (2006.01) |
| H04L 27/36 | (2006.01) |
| H04M 3/34 | (2006.01) |

(52) U.S. Cl.
CPC ......... *H04B 7/0417* (2013.01); *H04B 7/0456* (2013.01); *H04B 7/0632* (2013.01); *H04L 25/03343* (2013.01); *H04L 25/03891* (2013.01); *H04L 27/368* (2013.01); *H04M 3/34* (2013.01); *H04B 2001/0425* (2013.01); *H04L 2025/03426* (2013.01)

(58) Field of Classification Search
CPC .. H04B 17/336; H04B 1/0483; H04B 17/101; H04B 3/32; H04L 25/03343; H04L 2025/03426; H04L 25/0204; H04L 27/2614; H04L 27/367; H03F 1/3247; H03F 1/3252; H03F 3/24; H03F 2200/451; H04M 3/34; H01Q 1/523
See application file for complete search history.

(56) References Cited

U.S. PATENT DOCUMENTS

2013/0109325 A1* 5/2013 Afsahi ................. H04B 17/13
455/73
2016/0191176 A1* 6/2016 O'Keeffe ............... H04B 17/11
455/63.4

OTHER PUBLICATIONS

Suryasarman et al. "digital pre-distortion for multiple antenna transmitters"; Proceedings of the 43rd European Microwave Conference; pp. 412-413; year 2013.*
Suryasarman et al., "A Comparative Analysis of Adaptive Analysis of Digital Predistortion Algorithms for Multiple Antenna Transmitters", IEEE Transactions on circuits and systems , I: Regular Papers, vol. 62, No. 5, May 1, 2015.
Bassam et al., "Crossover Digital Predistorter for the Compensation of Crosstalk and Nonlinearity in MIMO Transmitters", IEEE Transactions on microwave theory and techniques, vol. 57, No. 5, May 1, 2009.
Gu et al., "Adaptive Crossover and Crosstalk Canceling DPD for MIMO Transmitters", 2016 6th International Conference on Electronics Information and Emergency Communication (ICEIEC), IEEE, Jun. 17, 2016, pp. 236-239.
Amin et al., "Behavioral Modeling and Linearization of Crosstalk and Memory Effects in RF MIMO Transmitters", IEEE Transactions on Microwave Theory and Techniques, vol. 62, No. 4, Apr. 1, 2014.
Amin et al., "Estimation of crossover DPD using orthogonal polynomials in fixed point arithmetic", International Journal of Electronics and Communications, 2013.
Fager et al., "Prediction of Smart Antenna Transmitter Characteristics Using a New Behavioral Modeling Approach", IMS 2014.

* cited by examiner

FIG. 5
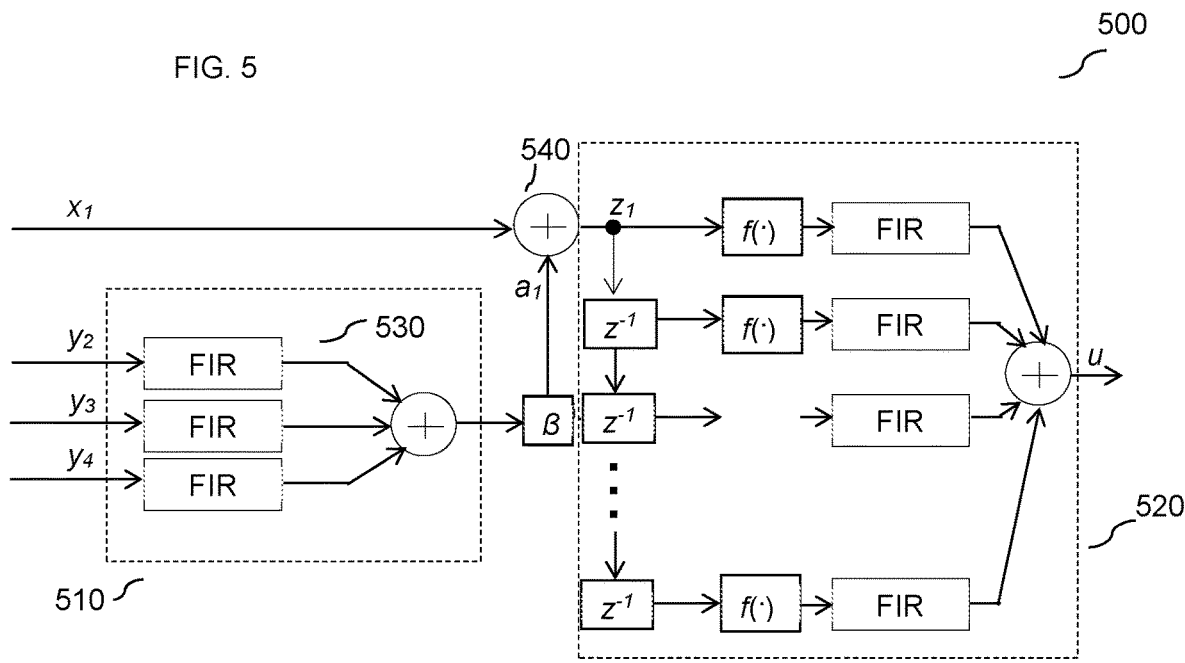
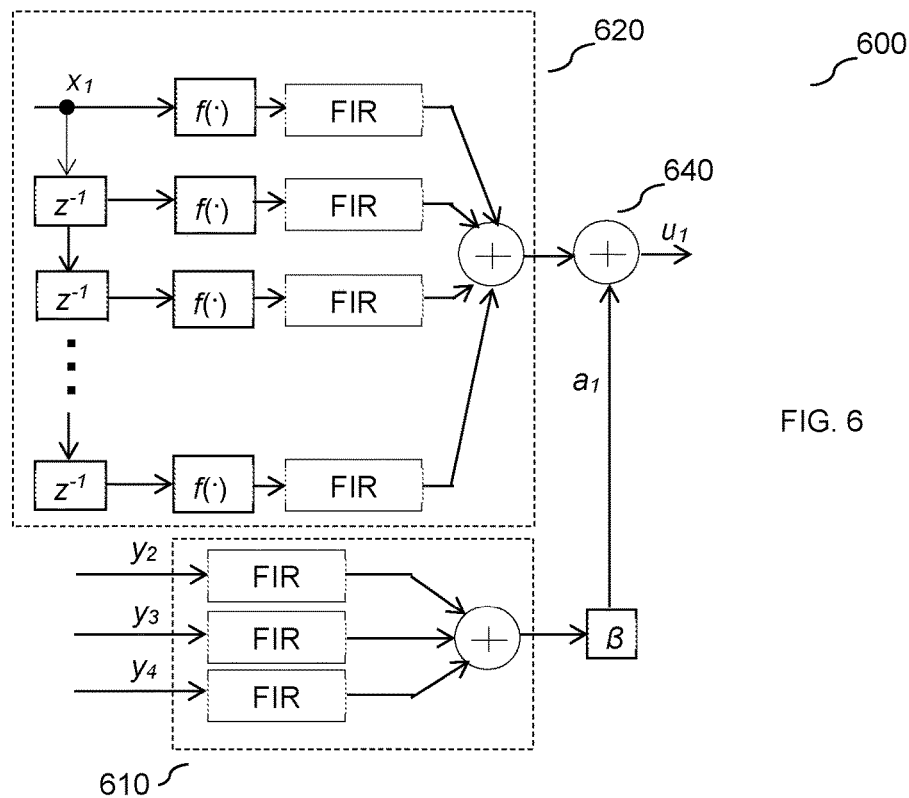
FIG. 6

US 10,892,788 B2

LOW COMPLEXITY MIMO DIGITAL PRE-DISTORTION

RELATED APPLICATIONS

This application is a national stage application of International Patent Application No. PCT/IB2017/052037, filed Apr. 7, 2017, the disclosure of which is hereby incorporated herein by reference in its entirety.

TECHNICAL FIELD

Certain embodiments relate, in general, to wireless signal processing in wireless networks and, more particularly, to Multiple-Input Multiple-Output (MIMO) digital pre-distortion (DPD) signal processing.

BACKGROUND

To meet the requirements of higher wireless transmission data rates within the scarce spectrum resource in the near future, the communications industry is looking to more advanced technologies in addressing this need. Massive MIMO, for example, is one of the most promising technologies in this context. Unlike the conventional single-input single-output (SISO) architecture, a MIMO architecture has many signal branches. A signal branch may also be referred to as a data path or radio channel, which may be further associated with a transmitting and receiving antenna at each end of the signal branch. Thus, MIMO allows for transmitting and/or receiving the same data over multiple data paths simultaneously, i.e. between multiple transmit and receive antennas. For example, a MIMO transmitter configuration may provide for transmitting the same data over multiple signal branches, and a MIMO receiver configuration may provide for receiving the same data on multiple signal branches. Cross talk occurring among and between these multiple transmit/receive data paths is one of the main issues to be addressed in MIMO architectures, particularly at a transmitter. However, due to the existence of cross talk associated with multiple signal branches in MIMO, the conventional DPD techniques used in a typical SISO architecture are no longer able to suppress all the impairments in MIMO transmitters.

Several approaches have been proposed to mitigate both linear and nonlinear cross talk in MIMO. Although previously considered approaches may be able to cancel the cross talk, the complexity of the algorithms for handling multiple data paths is an issue. For example, considering only a two branch MIMO architecture, i.e. a transmitter arrangement for transmitting on two signal branches, the algorithm needs to take into account two input signals. If more branches are used, which is a common configuration in deployed systems, the algorithm will need to include all the input signals from all other signal branches to cancel the cross talk affecting the current branch. This creates a multi-dimensional optimization problem and will consume a lot of resources in a commercial product. Additionally, the previously considered cross talk models are rather simple. For example, these cross talk models consider only frequency independent cross talk. However, in future radio products, the industry will need to support signal bandwidth in the range of GHz, in which case, the cross talk may be frequency dependent.

It is therefore desirable to provide a solution to reduce crosstalk in MIMO scenarios, using a less complex solution and which may also be frequency dependent.

SUMMARY

Disclosed herein is a solution for reducing crosstalk and power amplifier (PA) distortions in MIMO configurations. This solution modifies conventional SISO digital pre-distortion (DPD) architecture for use with more complex MIMO configurations thus providing the advantage of a low-complexity solution, even in massive MIMO configurations. For example, the complexity of the proposed solution does not increase much from the conventional SISO DPD architecture, even with a large number of signal branches, and also improves the signal quality by removing more signal impairments in a MIMO configuration. This low-complexity solution provides a further advantage of using fewer resources than prior cross talk MIMO solutions, such that the proposed solution may be implemented in products more easily. Certain embodiments disclosed herein may have the further advantage of being frequency dependent.

According to a first aspect, a method for cancelling cross talk and correcting power amplifier (PA) distortion for a transmitter branch of a multiple-input multiple-output (MIMO) configuration having multiple branches is provided. In an embodiment of the first aspect, the method combines an original baseband input signal received on a first MIMO transmitter branch with a crosstalk output signal generated from two or more signals associated with two or more respective MIMO branches, the two or more signals used as input to, and processed by, a crosstalk model. The method further processes the combined signal to generate an output signal in order to minimize the error of the original baseband input signal caused by the crosstalk and/or PA distortion. In a second embodiment of the first aspect, the combined signal is pre-distorted before generating the output signal. In a third embodiment, the original baseband input signal is digitally pre-distorted before combining with the crosstalk output signal. In a fourth embodiment, the two or more signals are associated with one of input signals or output signals of the two or more respective MIMO branches. In a fifth embodiment, processing the combined signal further comprises inputting the combined signal to a power amplifier (PA). In a sixth embodiment, processing the combined signal further comprises up-converting the combined signal, power amplifying the up-converted signal, and down-converting the amplified signal. In a seventh embodiment, the method further comprises measuring the error energy of the down-converted signal and the original baseband input signal, and when the energy is minimized between the output signal and the original baseband input signal, saving the weighting coefficients for the transmitter branch. In an eighth embodiment, the method further comprises adapting weighting coefficients for signal processing on the current branch in response to error energy minimized.

In a second aspect, a transmitter arrangement for cancelling cross talk and correcting power amplifier (PA) distortion for a transmitter branch of a multiple-input multiple-output (MIMO) configuration having multiple branches is provided. In an embodiment of the second aspect, the transmitter arrangement comprises an interface for receiving an original baseband signal on a first MIMO branch. The transmitter arrangement further comprises processing circuitry configured to combine the original baseband input signal received on the first MIMO transmitter branch with a crosstalk output signal generated from two or more signals associated with two or more respective MIMO branches, the two or more signals used as input to, and processed by, a crosstalk model. The processing circuitry is further configured to process the combined signal to generate an output signal in order to minimize the error of the original baseband input signal caused by the crosstalk and/or PA distortion.

In a third aspect, a transmitter arrangement for cancelling cross talk and correcting power amplifier (PA) distortion for a transmitter branch of a multiple-input multiple-output (MIMO) configuration having multiple branches is provided. In an embodiment of the third aspect, the transmitter arrangement comprises a processing circuitry comprising a memory and a processor, and the memory having instructions. The processor, when executing the instructions, cause the transmitter arrangement to combine an original baseband input signal ($x_1$) received on the first MIMO transmitter branch with a crosstalk output signal generated from two or more signals associated with two or more respective MIMO branches, the two or more signals used as input to, and processed by, a crosstalk model. The processor, when executing the instructions, further cause the transmitter arrangement to process the combined signal to generate an output signal ($y_1$) in order to minimize the error of the original baseband input signal ($x_1$) caused by the crosstalk and/or PA distortion.

In a fourth aspect, a transmitter arrangement for cancelling cross talk and correcting power amplifier (PA) distortion for a transmitter branch of a multiple-input multiple-output (MIMO) configuration having multiple branches is provided. The transmitter arrangement comprises processing circuitry. The processing circuitry is configured to execute a receiving unit for receiving an original baseband signal on a first MIMO branch, and a combining unit for combining an original baseband input signal received on the first MIMO transmitter branch with a crosstalk output signal generated from two or more signals associated with two or more respective MIMO branches, the two or more signals used as input to, and processed by, a crosstalk model. The processing circuitry is further configured to execute a processing unit configured for processing the combined signal to generate an output signal in order to minimize the error of the original baseband input signal caused by the crosstalk and/or PA distortion.

In a fifth aspect, a network node is provided. The network node comprises a transmitter arrangement according to any of the second, third, and fourth aspects.

In a sixth aspect, a computer program is provided. The computer program comprises instructions which when executed by a processor, cause the processor to perform the method according the first aspect and any of its embodiments.

It is to be noted that any feature of any of the embodiments disclosed herein may be applied to any other embodiment, wherever appropriate. Likewise, any advantage of any of the embodiments may apply to the other embodiments, and vice versa. Other objectives, features and advantages of the enclosed embodiments will be apparent from the following description.

Generally, all terms used herein are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

FIG. 5 illustrates a transmitter arrangement of the proposed MIMP DPD with crosstalk model.

FIG. 6 illustrates an alternative arrangement of the proposed MIMP DPD with crosstalk model.

DETAILED DESCRIPTION

Figure 1:
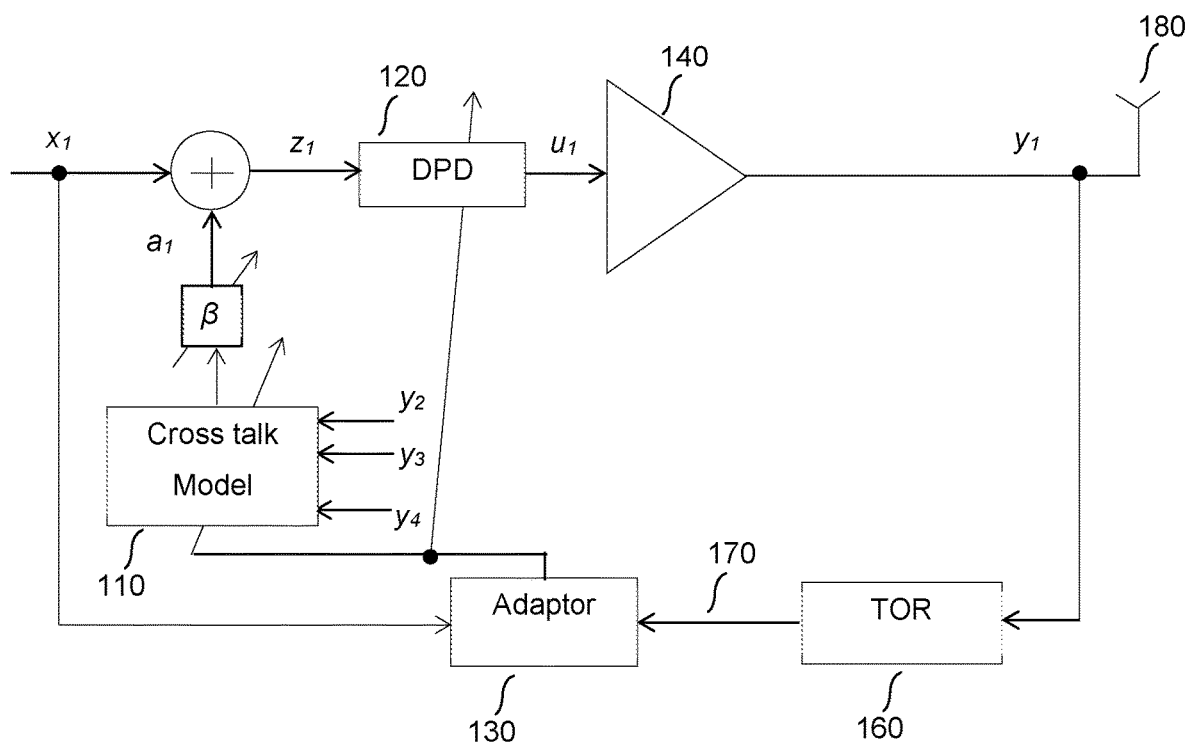
FIG. 1 illustrates a block diagram for the MIMO DPD arrangement with crosstalk model.

Some of the embodiments contemplated herein will now be described more fully hereinafter with reference to the accompanying drawings. Other embodiments, however, are contained within the scope of this disclosure and the invention should not be construed as limited to only the embodiments set forth herein; rather, these embodiments are provided by way of example to help convey the scope of the inventive concept to those skilled in the art. If used, like numbers refer to like elements throughout the description.

Certain embodiments of the present disclosure may provide improvements in MIMO digital pre-distortion (DPD) and crosstalk cancellation. These improvements are possible even when there a large number of signal branches in a MIMO configuration.

An exemplary basic DPD that may be implemented in a SISO architecture is described. In one embodiment, if x denotes an input signal from a single signal branch and u denotes the output signal from the DPD, respectively, one may write the following equation:

$$u = \Sigma_{m=0}^{M} f(|x(n-m)|) x(n-m) \qquad (1)$$

where $f$ is the nonlinear transfer function, n is the sample instance of the signal in discrete time, and m denotes the memory depth of the DPD, respectively. In another embodiment, discrete time n may be replaced with continuous time t in Eq. (1). The DPD function of Eq. (1) is one possible DPD function, and the proposed solution is not limited to this function. In other embodiments, Eq. (1) may be replaced by another DPD function.

In a MIMO architecture, potential interference may be caused by multiple signal branches and therefore, each of these other branches should be considered when transmitting a signal from any other branch of a transmitter in a MIMO configuration. For example, cross talk created at a transmitter by multiple MIMO signal branches should be compensated for to correct the disturbance interfering with an output signal on another branch. A MIMO DPD is thus proposed in which the MIMO DPD differs from the conventional SISO DPD in that the input signal x, which was input from a single signal branch in the conventional SISO configuration, is now a composite signal of the output signal from a cross talk model and the original input signal x. Note that, for simplicity, a MIMO system with four branches is used as an example. Those skilled in the art can easily extend the method for any number of branches.

An embodiment of a MIMO DPD, based on the DPD function of Eq. (1), is shown with the following equations:

$$u_i(n) = \sum_{m=0}^{M} f(|z_i(n-m)|)z_i(n-m) \quad (2)$$

$$z_i(n) = x_i(n) + \beta \cdot a_i(n) \quad (3)$$

$$a_i(n) = \sum_{j \neq i} \sum_{k=0}^{K} s_{i,j,k} y_j(n-k) \quad (4)$$

where in each of Eq. (2)-(4), index i denotes the current signal branch, and j denotes the signal branches other than the current signal branch i.

As shown by comparing the DPD equations Eq. (1) and Eq. (2), the equations are identical in structure with the only difference being the input, i.e. Eq. (1) uses original input signal x as the input, and Eq. (2) uses a combined signal $z_i$ which is the sum of the original input signal $x_i$ (representing the current signal branch) and the scaled output from the cross talk model. Eq. (3) is shown to compute the combined signal $z_i$, where $\beta$ may be a tunable complex coefficient or a complex filter function applied to the crosstalk model output to generate the scaled output, which is summed with the original input signal $x_i$. Eq. (4) is shown to compute the output signal $a_i$ of the cross talk model 110, where $y_j$ is an output signal of one of the other branches of the transmitter and s represents the model coefficients. In some embodiments, the $y_j$ signals may be reflected signals from the other branches. In other possible embodiments, the input to the crosstalk model may comprise modelled input signals of the other signal branches j, e.g. $x_2$, $x_3$, $x_4$. Thus, in an embodiment, the relationship between the equations may be as follows: the output $a_i$ of a crosstalk model Eq. (4) is applied as input to Eq. (3) which outputs the combined signal $z_i$. The combined signal $z_i$ is then applied as input to the DPD function of Eq. (2) to pre-distort the signal and generate output signal $u_i$ for further processing.

FIG. 1 is a block diagram illustrating an overview of a transmitter arrangement configured to implement an embodiment of the proposed solution, that may be realized using the above equations, i.e. Eq. (2) to (4). In this embodiment, the output $a_1$ of the cross talk model 110 (e.g. Eq. (4)) is combined with an original input signal $x_1$ of the current branch (e.g. Eq. (3)) to form a combined signal $z_1$, which is then applied as the input to the MIMO DPD 120 (e.g. Eq. (2)). The resulting output of the DPD 120 $u_1$ is then applied as input to a power amplifier (PA) 140. Further processing (not shown) of the signal $u_1$ may be performed when generating measured output signal $y_1$ The further processing may include, but is not limited to, e.g. processing the signal $u_1$ by a bandpass filter. The output signal $y_1$ may be further applied as input to the transmitter observation receiver (TOR) 160 which acts as a downconversion and digitization module. The output 170 of TOR 160 may be then applied, along with the original signal $x_1$, as input to an adaptor 130, which may adjust the cross talk model 110 coefficients, and the DPD 120 coefficients $\beta$. These adapted coefficients may subsequently be applied to cross talk model 110, thereby adapting the output $a_1$ of the cross talk model 110 resulting from the change in the coefficients.

Thus, in some embodiments of FIG. 1, some or all of the cross talk model 110 coefficients, DPD 120 coefficients $\beta$, and the output $a_1$ of the cross talk model 110, may be further adapted at adaptor 130 based on the measured output signal $y_1$ and the original input signal $x_1$. The purpose of this adaptation process is to minimize the error between the input and output signals at a MIMO transmitter arrangement for the current signal branch i (where i=1) when the error is caused by crosstalk interference and non-linearization, which may be caused both by the other signal branches j in the MIMO configuration and the PA 140.

Different strategies may be applied for adaptation of the DPD and cross talk models, which one of skill in the art would be able to recognize. In an alternative embodiment, the cross talk model coefficients may be identified first and the DPD coefficients may be identified in a separate step, then further iteration between these two steps may be performed until the errors of the input and output signals are minimized. In another embodiment, the DPD and cross talk model coefficients may be jointly optimized. For example, if the results of Eq. (3) and (4) are used as input to Eq. (2), Eq. (2) may be written as the following Eq. (5):

$$u_i(n) = \sum_{m=0}^{M} f(|x_i(n-m) + \beta \cdot a_i(n-m)|)(x_i(n-m) + \beta \cdot a_i(n-m)) \quad (5)$$

$$= \sum_{m=0}^{M} f\left(\left|x_i(n-m) + \beta \cdot \sum_{j \neq i}\sum_{k=0}^{K} s_{i,j,k} y_j(n-k)\right|\right)$$

$$\left(x_i(n-m) + \beta \cdot \sum_{j \neq i}\sum_{k=0}^{K} s_{i,j,k} y_j(n-k)\right)$$

As shown, in Eq. (5), the cross talk model 110 coefficients s are inside the nonlinear transfer function f. Thus, one of skill in the art may use advanced nonlinear identification methods to obtain the DPD 120 coefficients $\beta$ and cross talk model 110 coefficients s simultaneously. These examples for adapting the coefficients in the transmitter arrangement are non-limiting, and one of skill in the art may implement other embodiments for determining and adapting the coefficients for the transmitter arrangement.

In another embodiment of a transmitter arrangement configured to implement the proposed solution in a MIMO configuration, the original signal $x_1$ may pre-distorted by DPD 120 prior to being combined with the output $a_1$ of the cross talk model 120 (whereas in the embodiment of FIG. 1, pre-distortion is performed on the combined signal $u_1$). The combined signal $u_1$ may be then applied as input to the PA 140. In this arrangement, the combined signal $u_1$ may be calculated using Eq. (2a):

$$u_i(n) = \Sigma_{m=0}^{M} f(|x_i(n-m)|)x_i(n-m) + \beta \cdot a_i(n) \quad (2a)$$

Figure 2:
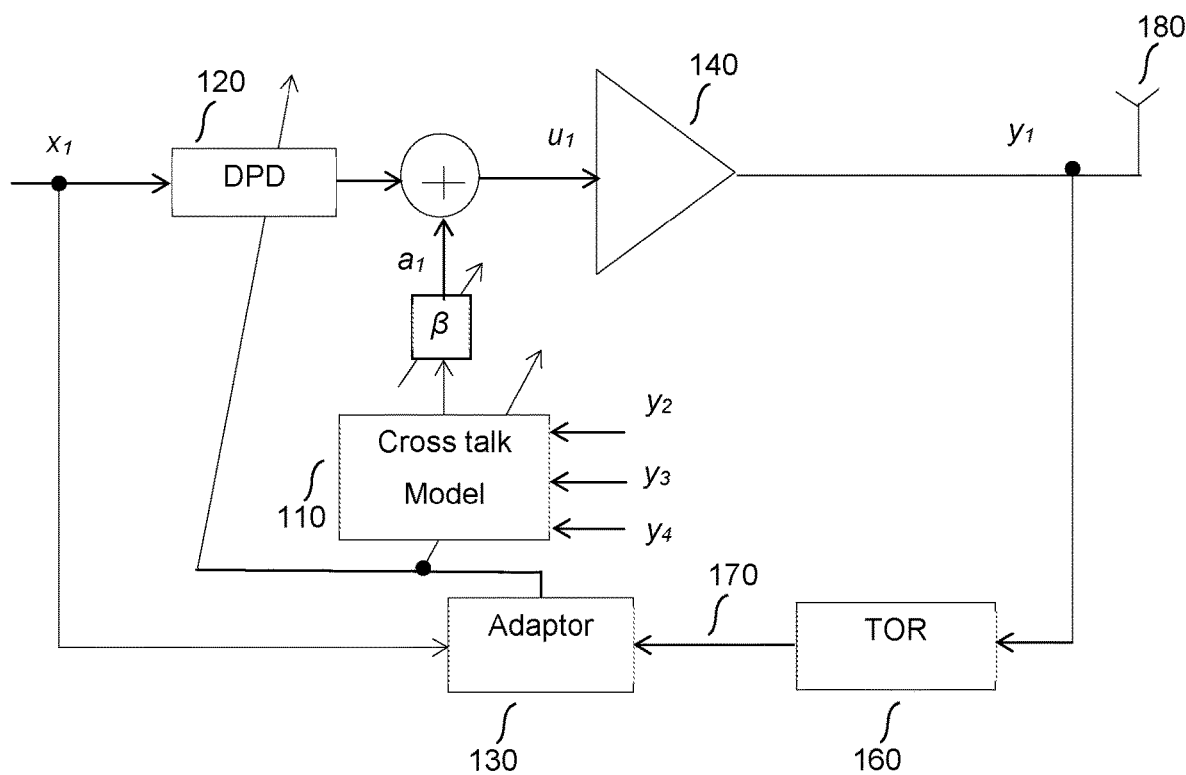
FIG. 2 is a simplified block diagram for an alternative MIMO DPD arrangement with crosstalk model.

FIG. 2 illustrates a block diagram of this embodiment of a transmitter arrangement according to Eq. (2a). In this embodiment of FIG. 2, the original input signal $x_1$ is pre-distorted by DPD 120 before being combined with the crosstalk model output 110. For example, original input signal $x_1$ is input to DPD 120 (c.f. FIG. 1 where combined signal $u_1$ is input to DPD 120). The output of DPD 120 is then combined with the output $a_1$ of the crosstalk model 110. The resulting combined signal $u_1$ is then input to the PA 140. The remainder of the transmitter arrangement of the embodiment of FIG. 2 is similar to the arrangement of FIG. 1 and therefore, is not further described here. In the proposed transmitter arrangement of FIG. 2, one of skill in the art may recognize that while it may be simpler to identify the DPD and cross-talk model coefficients, the cross-talk cancellation performance may be worse than the transmitter arrangement of FIG. 1, which is the preferred transmitter arrangement embodiment.

Figure 3:
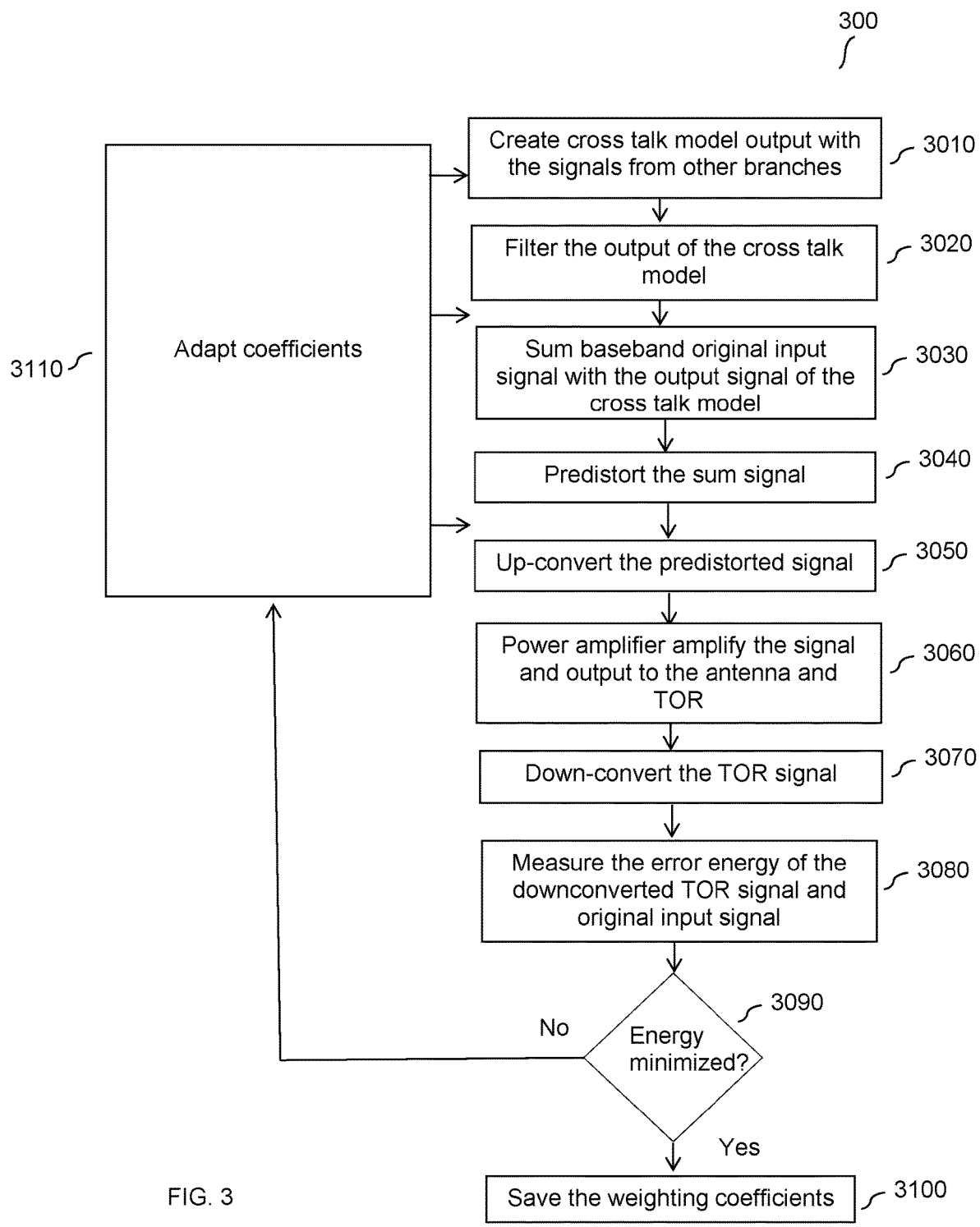
FIG. 3 is a flowchart of a method of the proposed MIMO DPD with crosstalk model.
Figure 4:
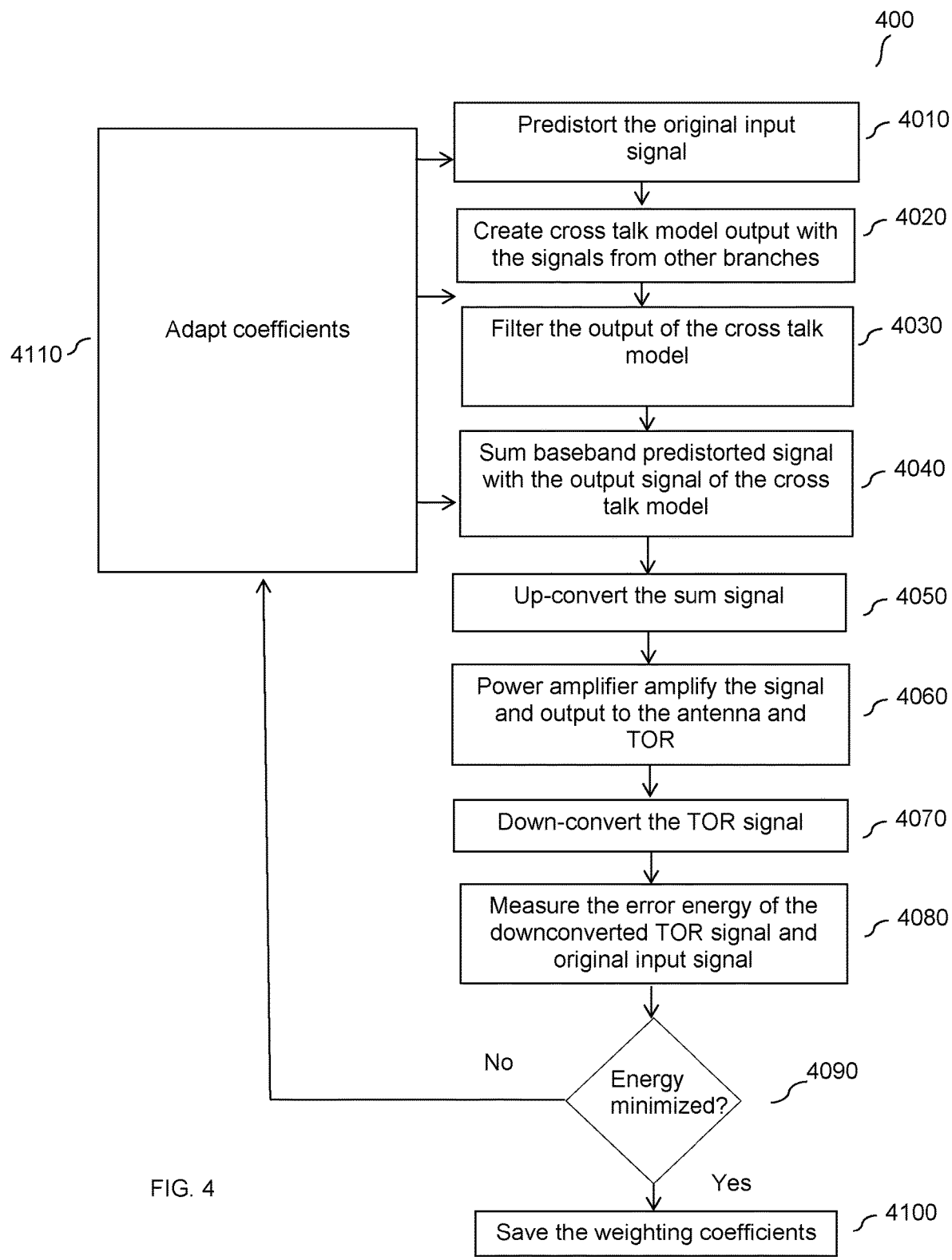
FIG. 4 is a flowchart of an alternative method of the proposed MIMO DPD with crosstalk model.

FIG. 3 and FIG. 4 illustrate flowcharts for methods 300 and 400, respectively, of the proposed transmitter arrangements in a MIMO configuration, as disclosed in FIG. 1 and FIG. 2, respectively.

In method 300 of FIG. 3, at 3010, the crosstalk model 110 uses as input signals from the other branches in the MIMO configuration. These signals may be interference caused by signals transmitted on other branches j (e.g. $y_2$, $y_3$, $y_4$) of the MIMO transmitter. At 3020, the output $a_1$ of the crosstalk model 110 is then filtered, e.g. by scaling the output with the β coefficient. At 3030, the original signal $x_1$ is summed, or combined, with the output signal $a_1$ of the cross talk model 110. After combining, at 3040, the combined signal is pre-distorted by DPD 120. At 3050, the pre-distorted signal may be then up-converted. At 3060, the PA 140 amplifies the signal and outputs the signal to the transmit antenna 180 and to the TOR 160. At 3070, the TOR signal is down-converted. At 3080, the error energy of the down-converted TOR signal and the original signal $x_1$ is measured. At 3090, it is determined whether the energy was minimized, which indicates whether the interference has been sufficiently compensated for. If the energy has been minimized, the weighting coefficients are saved 3100. If the energy has not been minimized, at 3110, the transmitter arrangement adapts the coefficients to further minimize the energy and improve the quality of output signal $y_1$ to be transmitted, and updates some or all of the coefficients in the crosstalk model 110, the DPD 120, and the filter, i.e. β, with the adapted coefficients.

In FIG. 4, a flowchart of method 400 illustrates an alternative embodiment for the transmitter arrangement. The first steps, 4010-4040, are distinguished from the method of FIG. 3 as follows. At 4010, the transmitter arrangement pre-distorts the original baseband input signal. Separately, the crosstalk model creates output based on the signals from the other branches, using the signals from the other branches as input to the crosstalk model. The output of the crosstalk model is filtered at 4030, then summed with the baseband pre-distorted signal at 4040. The remaining processing of the signal in steps 4050 through 4110 are substantially similar to steps 3050 through 3110, as discussed above. For example, at 4050, the pre-distorted signal is then up-converted. At 4060, the PA 140 amplifies the signal and outputs the signal to the transmit antenna 180 and to the TOR 160. At 4070, the TOR signal is down-converted. At 4080, the error energy of the down-converted TOR signal and the original signal $x_1$ is measured. At 4090, it is determined whether the error energy was minimized, which indicates whether the interference(s) has been sufficiently compensated for. If the error energy has been minimized, the weighting coefficients are saved 4100. If the error energy has not been minimized, at 4110, the transmitter arrangement adapts the coefficients to further minimize the error energy and improve the quality of output signal $y_1$ to be transmitted, and updates some or all of the coefficients in the crosstalk model 110, the DPD 120, and the filter, i.e. β, with the adapted coefficients.

FIG. 5 illustrates an embodiment of an implementation 500 of the crosstalk model 110 and the DPD 120 of the proposed solution associated with the transmitter arrangement of FIG. 1 and the method of FIG. 3. In this embodiment, a crosstalk model 510 comprises a series of finite impulse response (FIR) filters 530. The input to the crosstalk model 510 comprises signals from the other signal branches in the MIMO configuration branches, e.g. transmitted signals $y_2$, $y_3$, $y_4$, of the other branches j. Each of the input signals is processed by its respective FIR filter 530, and the respective outputs are summed together and filtered according to β coefficient, resulting in the crosstalk model output signal $a_1$. The output signal $a_1$ is then summed, or combined, with the original input signal $x_1$ at 540. The resulting signal $z_1$ is applied as input to the DPD 520. In this embodiment, the DPD 520 implementation also uses FIR filters. However, the implementation of the crosstalk model and the DPD are not limited to using FIR filters, and one of skill in the art may select any other appropriate filters in either or both the crosstalk model 510 and the DPD 520, as are suitable. The corresponding output of DPD 520 is signal $u_1$. This signal $u_1$ is further applied as input to the PA 140 and processed as described with respect to the transmitter arrangement of FIG. 1 and the method of FIG. 3.

FIG. 6 illustrates another embodiment of an implementation 600 of a transmitter arrangement comprising a crosstalk model 110 and a DPD 120 of the associated with the transmitter arrangement of FIG. 2 and corresponding method of FIG. 4. This implementation is distinguished from the implementation of FIG. 5 in that the original signal $x_1$ is applied as input to DPD 620 before the original signal $x_1$ is modified, i.e. before summing, or combining, the original signal $x_1$ with the crosstalk model output $a_1$ as in FIG. 5. Further in this embodiment, after the crosstalk model 610 and the DPD 620 functions are performed separately, the output of each of the functions is summed, or combined, at 640 to generate the combined signal $u_1$. The remainder of the signal processing for combined signal $u_1$ is the same as in the embodiment of FIG. 5, i.e. the resulting combined signal $u_1$ is applied as input to the PA and further processed as described with respect to the transmitter arrangement described in FIG. 2 and the method of FIG. 4.

Note that the coefficient β in FIGS. 5 and 6 is not limited, such that the coefficient β can be either a complex scalar or complex linear/nonlinear filter coefficient. Further, the DPD 520 and 620 illustrated in FIGS. 5 and 6 is only one implementation embodiment, and other implementations to realize the proposed solution are not limited by these implementation embodiments. One of skill in the art would recognize that other DPD architectures can be used to implement the proposed solution.

Figure 7A:
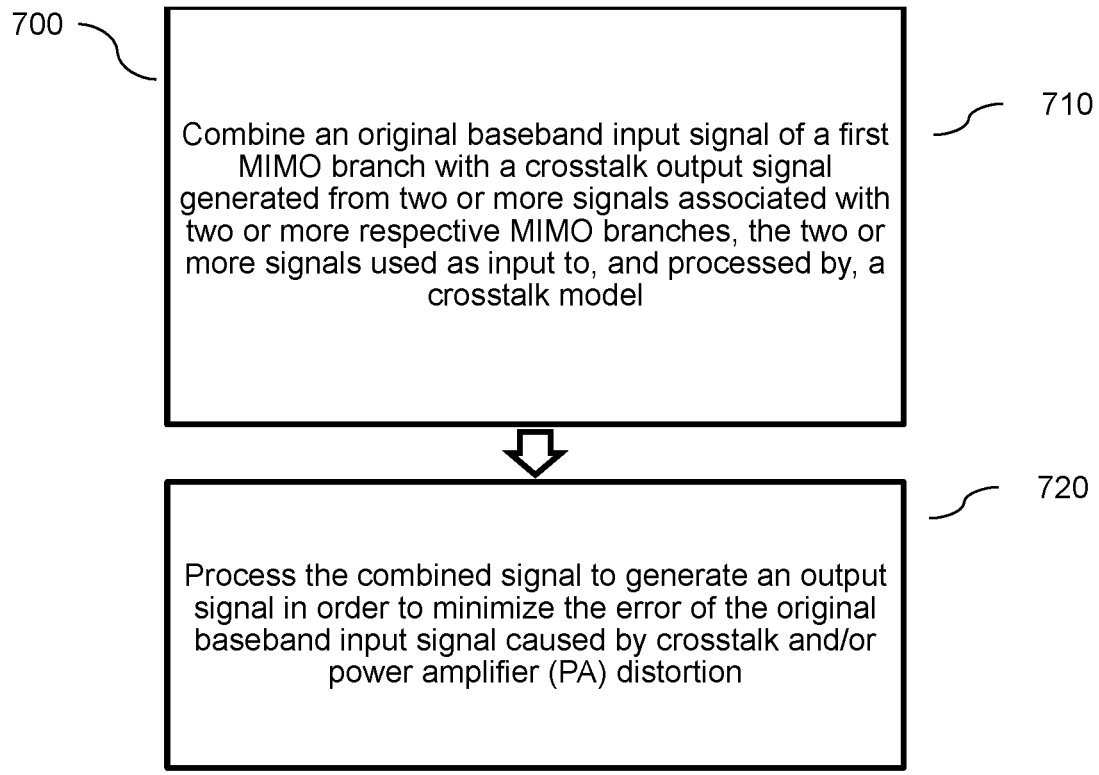
FIG. 7a-c illustrate flowcharts of various embodiments of the proposed MIMO DPD with crosstalk model.

FIG. 7a illustrates an embodiment of a method 700 of a transmitter arrangement. At step 710, the transmitter arrangement combines an original baseband input signal $x_1$ of a first MIMO branch with a crosstalk output signal $a_1$. The crosstalk output signal $a_1$ is generated from input of two or more signals respectively associated with two or more other MIMO signal branches j (e.g. $y_2$, $y_3$, $y_4$, where there are 4 total transmitter branches), where the two or more signals are used as input to, and are processed by, a crosstalk model to generate the crosstalk output signal. At 720, the transmitter arrangement processes the combined signal $u_1$ to generate an output signal minimizing the error of the original baseband input signal caused by cross talk and PA distortion.

Figure 7B:
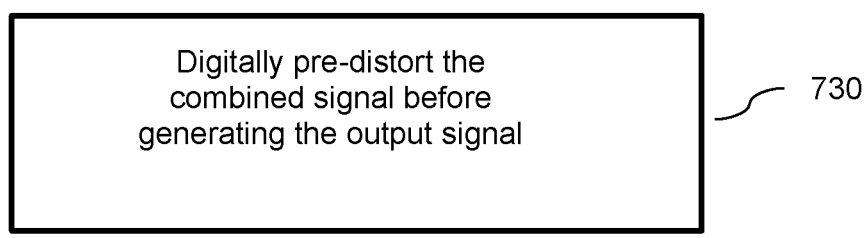
Figure 7C:
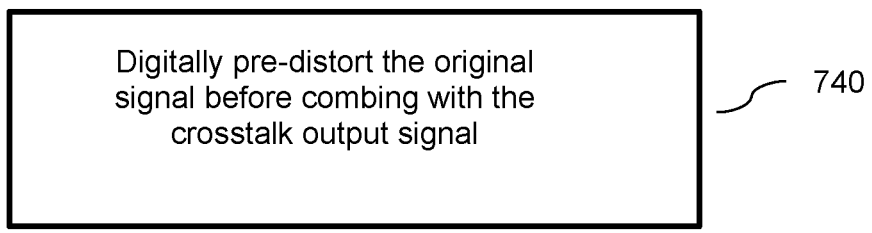

In an embodiment of FIG. 7b, at 730, the combined signal of FIG. 7a may be digitally pre-distorted before generating the output signal. In an alternative embodiment illustrated in FIG. 7c, at 740, the original signal may be digitally pre-distorted before being combined with the crosstalk output signal, as in FIG. 7a. Thus, FIGS. 7b-7c present alternative embodiments of when to perform DPD, and which signal shall be input to the DPD.

In some embodiments herein, the number of total signal branches is given as four signal branches. However, the proposed solution is not limited to a particular number of signal branches. For example, this solution is applicable whenever the number of signal branches >2. Currently, there is no upper limit to the number of signal branches contemplated for this solution. In particular, this solution may be implemented in a mass MIMO system, also referred to as a large-scale MIMO system, which may deploy hundreds of antennas at one base station. Indeed, one of the advantages of the proposed solution is that the complexity does not increase much from a SISO model even with a large number of signal branches, making the implementation of the proposed solution into products more easily. Further, the proposed solution does not need to construct multi-dimensional look-up tables (LUTs) and thus does not need to perform computationally expensive multi-dimensional searches. Another advantage of the proposed solution is that the cross talk model coefficients may be identified independently to the DPD coefficients.

Figure 8:
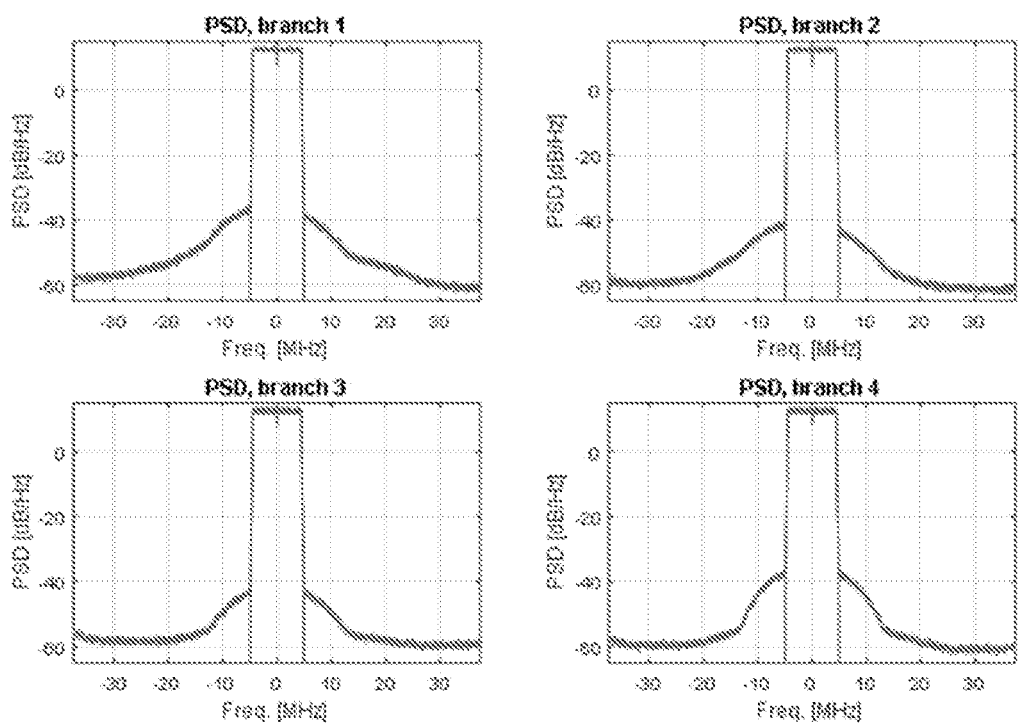
FIG. 8 illustrates measurement results of an embodiment of a transmitter arrangement.

FIG. 8 illustrates the measured results from processing a signal in accordance with an embodiment of FIG. 7, where the number of branches is 4. Without DPD applied in accordance with an embodiment of the proposed DPD method herein, the Adjacent Channel Leakage Ratio (ACLR) was −44 dB for all four transmitter branches, whereas with the proposed DPD method the ACLR is better than −55 dB.

The method embodiments and techniques described above may be implemented in a wireless communication network, e.g. in transmitter arrangements, which may be comprised in one or more network nodes, e.g. radio access nodes, such as eNBs, comprising transmit antennas in a MIMO configuration.

Figure 9A:
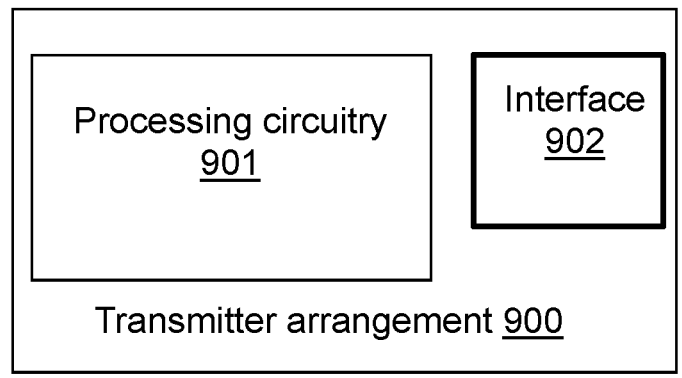
FIGS. 9a-c are schematic block diagrams illustrating alternate implementations of a transmitter arrangement according to exemplifying embodiments.

An exemplifying embodiment of a transmitter arrangement is illustrated in a general manner in FIG. 9*a*. The transmitter arrangement 900 is configured to perform at least one of the method embodiments described above, e.g. FIG. 7. The transmitter arrangement 900 is associated with the same technical features, objects and advantages as the previously described method embodiments. The transmitter arrangement will be described in brief in order to avoid unnecessary repetition.

The transmitter arrangement may be implemented and/or described as follows:

The transmitter arrangement 1100 comprises processing circuitry 1101, and one or more communication interfaces 1102. For example, the communication interface 1102 may comprise one or more interfaces for transmitting and receiving wireless communications on a current signal branch i of an antenna in a MIMO configuration. The communication interface may also be configured for a transceiver for both transmitting and receiving wireless communication signals on the current signal branch i. Each antenna or antenna element associated with a current signal branch i in a MIMO configuration includes the transmitter arrangement 1100 to provide digital pre-distortion and crosstalk cancellation associated with the other signal branches j in the MIMO configuration. The processing circuitry may be composed of one or more parts which may be comprised in one or more nodes in the communication network, but is here illustrated as one entity.

The processing circuitry 1101 is configured to cause the transmitter arrangement 1100 to combine an original baseband input signal $x_1$ received on a first MIMO branch with a crosstalk output signal $a_1$, the crosstalk output signal $a_1$ being generated from input of two or more signals respectively associated with two or more other MIMO signal branches j (e.g. $y_2, y_3, y_4$) where there are 4 total transmitter branches). The processing circuitry 1101 is further configured to cause the transmitter arrangement to process the combined signal $u_1$ to generate an output signal minimizing the error of the original baseband input signal caused by cross talk and PA distortion. The one or more communication interfaces 1102, include one or more interfaces for transmitting/receiving signals at an antenna in a MIMO configuration.

The processing circuitry 1101 could, as illustrated in FIG. 11*b*, comprise one or more processing means, such as a processor 1103, and a memory 1104 for storing or holding instructions. In an embodiment of FIG. 11*b*, the memory may comprise instructions, e.g. in form of a computer program 1105, which when executed by the one or more processors 1103 causes the network node or the transmitter arrangement 1100 to perform the actions and methods described above, e.g. the method of FIG. 7.

An alternative implementation of the processing circuitry 1101 is shown in FIG. 11*c*. The processing circuitry comprises a crosstalk model unit 1107, configured to cause the transmitter arrangement to create cross talk output associated with the signals from other branches. The processing circuitry may further comprise a combining unit 1106, configured to combine signals, according to any of the transmitter arrangements embodiments disclosed here, e.g. FIG. 5 and FIG. 6. The processing circuitry may further comprise a digital pre-distortion (DPD) unit 1108, configured to cause the transmitter arrangement to pre-distort an input signal, where the type of input signal to be pre-distorted is associated with the transmitter arrangement implemented, e.g. the input signal may be a sum, or combined, signal according to the transmitter arrangement in FIG. 5, or may be the original input signal according to the transmitter arrangement in FIG. 6.

The processing circuitry 1100 may further comprise more units, e.g. a power amplifier, a TOR unit, an adaptor unit, as well as other units (not shown), e.g. a bandpass filter, for performing further processing of the current branch signal i in the transmitter arrangement as described in, e.g. FIG. 3 and FIG. 4. The network transmitter arrangements described above may further be configured for any of the different method embodiments described herein.

The steps, functions, procedures, modules, units and/or blocks described for the transmitter arrangement herein may be implemented in hardware using any conventional technology, such as discrete circuit or integrated circuit technology, including both general-purpose electronic circuitry and application-specific circuitry.

Particular examples include one or more suitably configured digital signal processors and other known electronic circuits, e.g. discrete logic gates interconnected to perform a specialized function, or Application Specific Integrated Circuits (ASICs).

Alternatively, at least some of the steps, functions, procedures, modules, units and/or blocks described above may be implemented in software such as a computer program for execution by suitable processing circuitry including one or more processing units. The software could be carried by a carrier, such as an electronic signal, an optical signal, a radio signal, or on a non-transitory computer readable storage medium before and/or during the use of the computer program e.g. in one or more nodes of the wireless communication network.

The flow diagram or diagrams presented herein may be regarded as a computer flow diagram or diagrams, when performed by one or more processors. A corresponding transmitter arrangement or apparatus may be defined as a group of function modules, where each step performed by a processor corresponds to a function module. In this case, the function modules are implemented as one or more computer programs running on one or more processors.

Examples of processing circuitry 1100 of a transmitter arrangement include, but is not limited to, may be a combination of one or more of a microprocessor, controller, microcontroller, central processing unit (CPU), digital signal processor (DSP), application specific integrated circuit (ASIC), field programmable gate array (FPGA), Programmable Logic Controllers (PLCs), or any other suitable computing device, resource, or combination of hardware, software and/or encoded logic operable to provide, either alone or in conjunction with other components, such as memory 1104, the functionality of the transmitter arrangement 1100. That is, the units or modules in the arrangements in the communication network described above could be implemented by a combination of analog and digital circuits in one or more locations, and/or one or more processors configured with software and/or firmware, e.g. stored in a memory. One or more of these processors, as well as the other digital hardware, may be included in a single application-specific integrated circuitry, ASIC, or several processors and various digital hardware may be distributed among several separate components, whether individually packaged or assembled into a system-on-a-chip, SoC.

The memory 1104 may comprise any form of volatile or non-volatile computer readable memory including, without limitation, persistent storage, solid state memory, remotely mounted memory, magnetic media, optical media, random access memory (RAM), read-only memory (ROM), removable media, or any other suitable local or remote memory component. Memory 1104 may store any suitable instructions, data or information, including software and encoded logic, to be executed by the processing circuitry 1101 so as to implement the above-described functionalities of the transmitter arrangement 1100. Memory 1104 may be used to store any calculations made by processor 1103 and/or any data received via interface.

Figure 10:
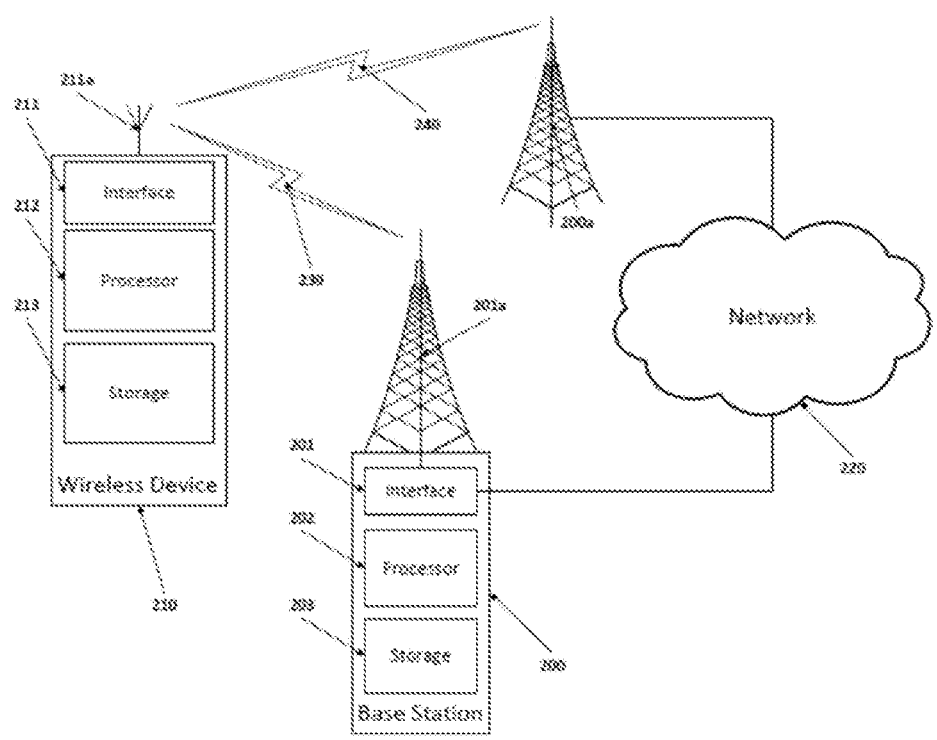
FIG. 10 illustrates a wireless communications network for implementing embodiments of the proposed solution.

FIG. 10 illustrates a wireless network that may implement the transmitter arrangement in network node. For simplicity, FIG. 10 only depicts network 220, network nodes 200 and 200*a*, and wireless device (WD) 210. Network node 200 comprises processor 202, storage 203, interface 201, and antenna 201*a*. Similarly, WD 210 comprises processor 212, storage 213, interface 211 and antenna 211*a*. These components may work together in order to provide network node and/or wireless device functionality, such as providing wireless connections in a wireless network. In different embodiments, the wireless network may comprise any number of wired or wireless networks, network nodes, base stations, controllers, wireless devices, relay stations, and/or any other components that may facilitate or participate in the communication of data and/or signals whether via wired or wireless connections.

Network 220 may comprise one or more IP networks, public switched telephone networks (PSTNs), packet data networks, optical networks, wide area networks (WANs), local area networks (LANs), wireless local area networks (WLANs), wired networks, wireless networks, metropolitan area networks, and other networks to enable communication between devices.

Network node 200 comprises processor 202, storage 203, interface 201, and antenna 201*a*. These components are depicted as single boxes located within a single larger box. In practice however, a network node may comprise multiple different physical components that make up a single illustrated component (e.g., interface 201 may comprise terminals for coupling wires for a wired connection and a radio transceiver for a wireless connection). Similarly, network node 200 may be composed of multiple physically separate components (e.g., a NodeB component and a RNC component, a BTS component and a BSC component, etc.), which may each have their own respective processor, storage, and interface components. In certain scenarios in which network node 200 comprises multiple separate components (e.g., BTS and BSC components), one or more of the separate components may be shared among several network nodes. For example, a single RNC may control multiple NodeB's. In such a scenario, each unique NodeB and BSC pair, may be a separate network node. In some embodiments, network node 200 may be configured to support multiple radio access technologies (RATs). In such embodiments, some components may be duplicated (e.g., separate storage 203 for the different RATs) and some components may be reused (e.g., the same antenna 201*a* may be shared by the RATs).

Processor 202 may be a combination of one or more of a microprocessor, controller, microcontroller, central processing unit, digital signal processor, application specific integrated circuit, field programmable gate array, or any other suitable computing device, resource, or combination of hardware, software and/or encoded logic operable to provide, either alone or in conjunction with other network node 200 components, such as storage 203, network node 200 functionality. For example, processor 202 may execute instructions stored in storage 203. Such functionality may include providing various wireless features discussed herein to a wireless device, such as WD 210, including any of the features or benefits disclosed herein.

Storage 203 may comprise any form of volatile or non-volatile computer readable memory including, without limitation, persistent storage, solid state memory, remotely mounted memory, magnetic media, optical media, random access memory (RAM), read-only memory (ROM), removable media, or any other suitable local or remote memory component. Storage 203 may store any suitable instructions, data or information, including software and encoded logic, to be executed by the processor 202 so as to implement the above-described functionalities of the network node 200. Storage 203 may be used to store any calculations made by processor 202 and/or any data received via interface 201.

Network node 200 also comprises interface 201 which may be used in the wired or wireless communication of signalling and/or data between network node 200, network 220, and/or WD 210. For example, interface 201 may perform any formatting, coding, or translating that may be needed to allow network node 200 to send and receive data from network 220 over a wired connection. Interface 201 may also include a radio transmitter and/or receiver that may be coupled to or a part of antenna 201*a*. The radio may receive digital data that is to be sent out to other network nodes or WDs via a wireless connection. The radio may convert the digital data into a radio signal having the appropriate channel and bandwidth parameters. The radio signal may then be transmitted via antenna 201*a* to the appropriate recipient (e.g., WD 210).

Antenna 201*a* may be any type of antenna capable of transmitting and receiving data and/or signals wirelessly. In some embodiments, antenna 201*a* may comprise one or more omni-directional, sector or panel antennas operable to transmit/receive radio signals between, for example, 2 GHz and 66 GHz. An omni-directional antenna may be used to transmit/receive radio signals in any direction, a sector antenna may be used to transmit/receive radio signals from devices within a particular area, and a panel antenna may be a line of sight antenna used to transmit/receive radio signals in a relatively straight line.

Figure 9B:
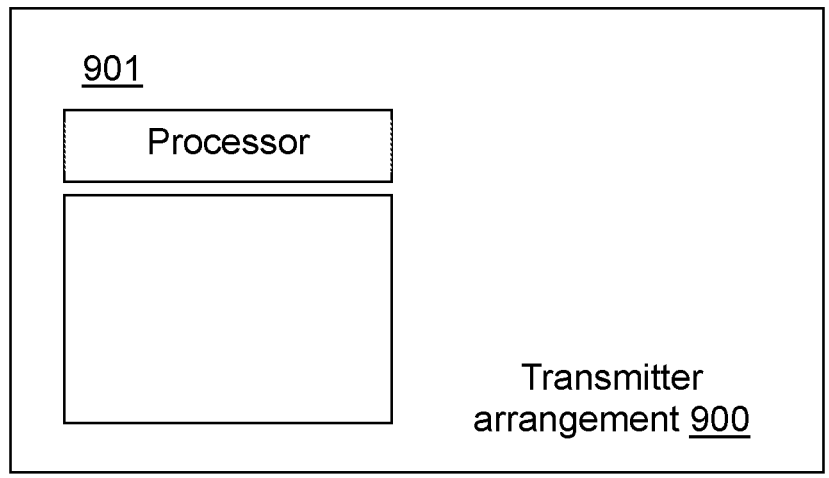
Figure 9C:
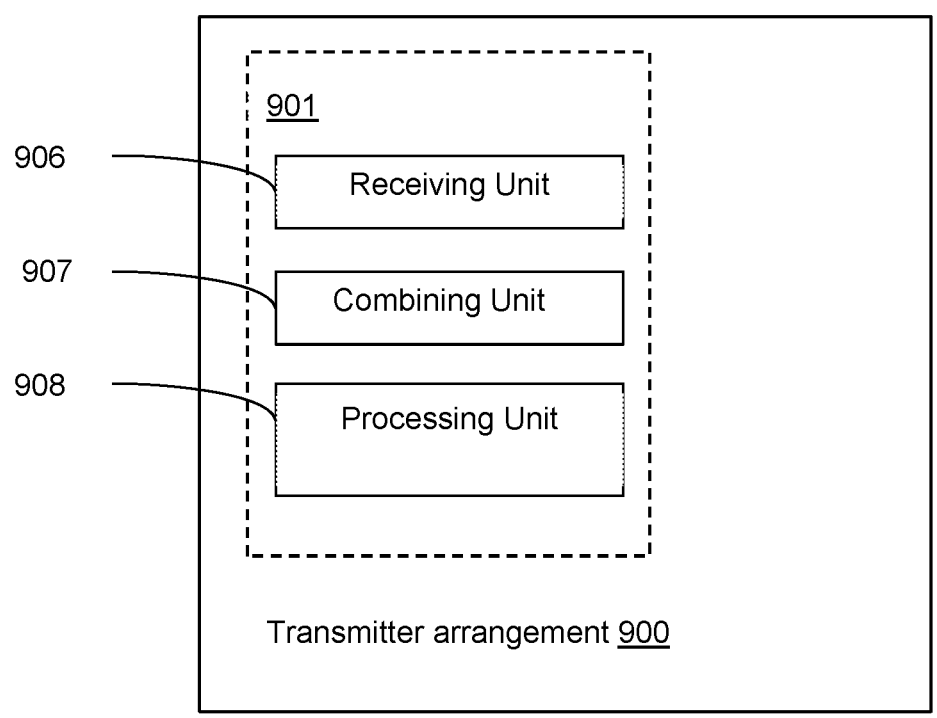

Network node 200 may comprise an embodiment of a transmitter arrangement described in, at least, any of FIGS. 9*a-c* for implementing the methods herein, an at least the method of FIG. 7.

WD 210 may be any type of wireless endpoint, mobile station, mobile phone, wireless local loop phone, smartphone, user equipment, desktop computer, PDA, cell phone, tablet, laptop, VoIP phone or handset, which is able to wirelessly send and receive data and/or signals to and from a network node, such as network node 200 and/or other WDs. WD 210 comprises processor 212, storage 213, interface 211, and antenna 211*a*. Like network node 200, the components of WD 210 are depicted as single boxes located within a single larger box, however in practice a wireless device may comprises multiple different physical components that make up a single illustrated component (e.g., storage 213 may comprise multiple discrete microchips, each microchip representing a portion of the total storage capacity).

Processor 212 may be a combination of one or more of a microprocessor, controller, microcontroller, central processing unit, digital signal processor, application specific integrated circuit, field programmable gate array, or any other suitable computing device, resource, or combination of hardware, software and/or encoded logic operable to provide, either alone or in combination with other WD 210 components, such as storage 213, WD 210 functionality. Such functionality may include providing various wireless features discussed herein, including any of the features or benefits disclosed herein.

Storage 213 may be any form of volatile or non-volatile memory including, without limitation, persistent storage, solid state memory, remotely mounted memory, magnetic media, optical media, random access memory (RAM), read-only memory (ROM), removable media, or any other suitable local or remote memory component. Storage 213 may store any suitable data, instructions, or information, including software and encoded logic, to be executed by the processor(s) 212 so as to implement the above-described functionalities of the WD 210. Storage 213 may be used to store any calculations made by processor 212 and/or any data received via interface 211.

Interface 211 may be used in the wireless communication of signalling and/or data between WD 210 and network node 200. For example, interface 211 may perform any formatting, coding, or translating that may be needed to allow WD 210 to send and receive data from network node 200 over a wireless connection. Interface 211 may also include a radio transmitter and/or receiver that may be coupled to or a part of antenna 211*a*. The radio may receive digital data that is to be sent out to network node 201 via a wireless connection. The radio may convert the digital data into a radio signal having the appropriate channel and bandwidth parameters. The radio signal may then be transmitted via antenna 211*a* to network node 200. In some embodiments, the WD, may transmit transmissions and retransmissions to the network node, and receive feedback from the network node.

Antenna 211*a* may be any type of antenna capable of transmitting and receiving data and/or signals wirelessly. In some embodiments, antenna 211*a* may comprise one or more omni-directional, sector or panel antennas operable to transmit/receive radio signals between 2 GHz and 66 GHz.

For simplicity, antenna 211*a* may be considered a part of interface 211 to the extent that a wireless signal is being used.

It should also be understood that it may be possible to re-use the general processing capabilities of any conventional device or unit in which the specific proposed technology is implemented. It may also be possible to re-use existing software, e.g. by reprogramming of the existing software or by adding new software components in order to implement the specific features of the proposed technological solution.

The embodiments described above are merely given as examples, and it should be understood that the proposed technology is not limited thereto. It will be understood by those skilled in the art that various modifications, combinations and changes may be made to the embodiments without departing from the present scope. In particular, different part solutions in the different embodiments can be combined in other configurations, where technically possible.

When using the word "comprise" or "comprising" it shall be interpreted as non-limiting, i.e. meaning "consist at least of".

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of inventive concepts.

It is to be understood that the choice of interacting units, as well as the naming of the units within this disclosure are only for exemplifying purpose, and nodes suitable to execute any of the methods described above may be configured in a plurality of alternative ways in order to be able to execute the suggested procedure actions.

It should also be noted that the units described in this disclosure are to be regarded as logical entities and not with necessity as separate physical entities.

Certain aspects of the inventive concept have mainly been described above with reference to a few embodiments. However, as is readily appreciated by a person skilled in the art, embodiments other than the ones disclosed above are equally possible and within the scope of the inventive concept. Similarly, while a number of different combinations have been discussed, all possible combinations have not been disclosed. One skilled in the art would appreciate that other combinations exist and are within the scope of the inventive concept. Moreover, as is understood by the skilled person, the herein disclosed embodiments are as such applicable also to other standards and communication systems and any feature from a particular figure disclosed in connection with other features may be applicable to any other figure and or combined with different features.

What is claimed is:

1. A method for cancelling crosstalk and correcting power amplifier (PA) distortion for a transmitter branch of a multiple-input multiple-output (MIMO) configuration having multiple branches, the method comprising:
combining an original baseband input signal of a first MIMO transmitter branch with a crosstalk output signal generated from two or more signals ($y_2$, $y_3$, $y_4$) associated with two or more respective MIMO branches to produce a combined signal, wherein the two or more signals are used as input to, and processed by, a crosstalk model;

digitally pre-distorting the combined signal; and processing the combined signal to generate an output signal in order to minimize error of the original baseband input signal caused by the crosstalk and/or PA distortion.

2. The method of claim 1, wherein the combined signal is digitally pre-distorted before generating the output signal.

3. The method of claim 1, wherein the original baseband input signal is digitally pre-distorted before combining with the crosstalk output signal.

4. The method of claim 1, wherein the two or more signals are associated with output signals of the two or more respective MIMO branches.

5. The method of claim 1, wherein processing the combined signal further comprises inputting the combined signal to a power amplifier (PA).

6. The method of claim 1, wherein processing the combined signal further comprises:

up-converting the combined signal;

power amplifying the up-converted signal; and down-converting the amplified signal.

7. The method of claim 6, further comprising:

measuring an error energy of the down-converted signal and the original baseband input signal; and when the error energy is minimized between the output signal and the original baseband input signal, saving weighting coefficients for the transmitter branch.

8. The method of claim 1, further comprising, adapting weighting coefficients for signal processing on the current branch in response to error energy minimized.

9. A transmitter arrangement for cancelling crosstalk and correcting power amplifier (PA) distortion for a transmitter branch of a multiple-input multiple-output (MIMO) configuration having multiple branches, comprising:

an interface for receiving an original baseband signal of a first MIMO branch;

processing circuitry configured to combine the original baseband input signal of the first MIMO branch with a crosstalk output signal generated from two or more signals associated with two or more respective MIMO branches to produce a combined signal, wherein the two or more signals are used as input to, and processed by, a crosstalk model;

digitally pre-distorting the combined signal; and the processing circuitry further configured to process the combined signal to generate an output signal in order to minimize error of the original baseband input signal caused by the crosstalk and/or PA distortion.

10. The transmitter arrangement of claim 9, wherein the processing circuitry digitally pre-distorts the combined signal before generating the output signal.

11. The transmitter arrangement of claim 9, wherein the processing circuitry digitally pre-distorts the original baseband input signal before combining with the crosstalk output signal.

12. The transmitter arrangement of claim 9, wherein the two or more signals are associated with output signals of the two or more respective MIMO branches.

13. The transmitter arrangement of claim 9, wherein the transmitter arrangement further comprises a power amplifier (PA), and wherein the processing circuitry is further configured to input the combined signal to the PA.

14. The transmitter arrangement of claim 9, wherein the processing circuitry is further configured to:

up-convert the combined signal;

power amplify the up-converted signal; and down-convert the amplified signal.

15. The transmitter arrangement of claim 14, wherein the processing circuitry is further configured to:

measure error energy of the down-converted signal and the original baseband input signal; and when the error energy is minimized between the output signal and the original baseband input signal, save weighting coefficients for the transmitter branch.

16. The transmitter arrangement of claim 15, wherein the processing circuitry is further configured to:

adapt the weighting coefficients for signal processing on the current branch in response to error energy minimization.

17. The transmitter arrangement of claim 9, wherein the interface and processing circuitry are included in a wireless device.

18. The transmitter arrangement of claim 9, wherein the interface and processing circuitry are included in a base station.

19. A non-transitory, tangible computer-readable memory having instructions that, when executed by processing circuitry, cause the processing circuitry to perform operations comprising:

combine an original baseband input signal of a first MIMO transmitter branch with a crosstalk output signal generated from two or more signals associated with two or more respective MIMO branches to generate a combined signal, the two or more signals being used as inputs to and processed by a crosstalk model;

digitally pre-distorting the combined signal; and process the combined signal to generate an output signal in order to minimize error of the original baseband input signal caused by the crosstalk and/or PA distortion.

20. The non-transitory, tangible computer-readable memory of claim 19, wherein the combined signal is digitally pre-distorted before generating the output signal.

* * * * *